United States Patent
Borrello

[11] Patent Number: 4,654,686
[45] Date of Patent: Mar. 31, 1987

[54] HIGH EFFICIENCY MIS DETECTOR

[75] Inventor: Sebastian R. Borrello, Dallas, Tex.

[73] Assignee: Texas Instruments Incorporated, Dallas, Tex.

[21] Appl. No.: 707,319

[22] Filed: Mar. 1, 1985

[51] Int. Cl.⁴ .................. H01L 27/14; H01L 31/00
[52] U.S. Cl. .............................. 357/30; 357/23.1; 357/61
[58] Field of Search .................... 357/30, 61, 23.1

[56] References Cited
U.S. PATENT DOCUMENTS
4,327,291 4/1982 Chapman et al. .................. 357/30

Primary Examiner—William L. Sikes
Assistant Examiner—Georgia Y. Epps
Attorney, Agent, or Firm—Carlton H. Hoel; James T. Comfort; Melvin Sharp

[57] ABSTRACT

The disclosure relates to a photodetector, primarily for use in the infrared range, wherein a portion of the metal layer forming the gate is eliminated, resulting in no metal absorption loss and no differential tunnel breakdown. The system operates by establishing a fixed charge density at the semiconductor-insulator interface to create near flat band voltage in the open or hole area. No potential well is formed under the hole in the gate to collect charge so the metal gate formed around the hole controls the surface potential. Carriers generated in the hole area diffuse and drift to the potential wells created beneath the thick metal gate which surrounds the hole.

22 Claims, 5 Drawing Figures

HIGH EFFICIENCY MIS DETECTOR

BACKGROUND OF THE INVENTION

1. Field of the Invention

This invention relates to MIS photodetectors and, more specifically, to such detectors showing a high quantum efficiency in the infrared range.

2. Description of the Prior Art

MIS photodetectors are known in the prior art and are normally fabricated with a first semiconductor substrate layer, preferably of mercury cadmium telluride, though other semiconductor materials can be used, a transparent layer thereon, preferably of zinc sulfide, silicon dioxide or an oxide of the substrate material, though other transparent oxides can also be used and a thin top layer of transparent metal with a thick lattice structured metal thereover. In the prior art, the transparent metal utilized has preferably been a layer of nickel having a thickness of about 60 Angstroms and the thick lattice structured metal has been about 600 Angstrom thick aluminum. It has been found that the transparent metal layer typically absorbs from about 30 to 40 percent of the infrared transmissions passing therethrough, thereby causing a loss of system sensitivity. Also, the fixed charge in the insulating layer almost always has different density beneath the thick and thin portions of the metal layer, thereby resulting in premature tunnel breakdown and lost well capacity. It is readily apparent that the infrared transmissivity of the thin metal layer will be increased by decreasing the thickness thereof. However, in practice, it has been found that with layer thicknesses less than about 60 Angstroms, device yields drop off dramatically, thereby eliminating this procedure as an option.

MIS photodetectors require the metal gate in order to control surface potential in the region of the semiconductor surface. A potential well is created for collection of charge generated by the photons which excite electrons from the valence band edge to the conduction band edge to create free charge which is to be collected and stored. The metal gate is biased relative to the bulk of the semiconductor material to create the potential well for the collection of charge that is generated by the photons which enter the semiconductor and excite the electrons.

SUMMARY OF THE INVENTION

In accordance with the present invention, the above noted problem of the prior art is minimized and there is provided a photodetector for use, primarily in the infrared range, wherein transmission loss through the metal gate layer is substantially eliminated. This is accomplished in accordance with the present invention by elimination of the thin metal portion of the metal layer, resulting in no metal absorption loss and no differential tunnel breakdown. The charge collection efficiency remains high, in a range greater than 90 percent, as long as the diffusion distance to the potential wells is less than one diffusion length. Collection is greatly aided by the minority carrier diffusion field.

Briefly, the thin metal portion of the metal gate through which photons can pass is eliminated and a aperture is provided in the metal gate for passage of light flux therethrough. This arrangement does not permit control of surface potential in an adjustable manner beneath the aperture. Therefore, the surface potential in the semiconductor material beneath the aperture area can be anywhere from inversion to flat band to accumulation. However, it is desired to operate near the flat band region. The system operates by establishing a fixed charge density at the semiconductor-insulator interface to create near flat band voltage in the open or aperture area. No potential well is formed under the aperture in the gate to collect charge, so the metal gate formed around the aperture controls the surface potential. Carriers generated in the aperture area thereby diffuse and drift to the potential wells created beneath the thick metal gate which surrounds the aperture. It is therefore possible to eliminate one of the two gate layers of the prior art by eliminating the nickel layer and retaining only the thick aluminum lattice layer. This provides a simple structure relative to the prior art in that a processing step has been eliminated, thereby increasing the potential yield.

In the actual embodiment, there is provided a slab of semiconductor material, preferably mercury cadmium telluride, having a layer of insulating material thereon, preferably zinc sulfide, though other transparent insulating materials can be used, such as silicon oxide, oxides of mercury cadmium telluride and composites thereof. One or a plurality of spaced aluminum gate layers are then formed on the insulating layer with an aperture therethrough to permit photons of light to travel through the aperture and the transparent insulating material to the surface of the semiconductor substrate. Connection is then made to the aluminum gate layers to provide appropriate potentials thereon in order to create wells in the semiconductor bulk material beneath the gate layers to collect electrons in the wells in known manner and in the manner described hereinabove. A preferred structure for performing this function is to form a further insulating layer of transparent material and preferably of the same material as the first insulating layer over the aluminum gate member. A via is then cut through the insulating material from the surface thereof to the aluminum gate member. An aluminum conductor is then formed on the surface of the insulating material and connected by a conductive material deposited in the via to the now buried aluminum gate member. The aluminum conductors on the surface of the insulating material are connected to an appropriate biasing source and/or to appropriate circuitry for measuring the charge in the wells as is well known. It can be seen that there has been provided an MIS photodetector having higher quantum efficiency than prior art MIS detectors and also being fabricated by a process wherein the prior art steps required for deposition of the nickel layer can be eliminated.

DESCRIPTION OF THE PREFERRED EMBODIMENTS

Figure 1:
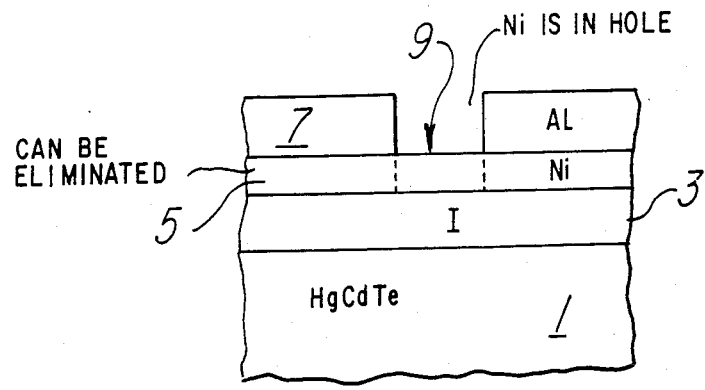
FIG. 1 is a sectional schematic view of a first embodiment of an MIS detector element in accordance with the present invention.

Referring now to FIG. 1, there is shown a first embodiment of the MIS infrared detector element in accordance with the present invention. The detector element includes a substrate 1 of doped semiconductor material, the preferred substrate material being mercury cadmium telluride. An insulating layer 3 is formed thereon of a transparent material, preferably zinc sulfide, though other transparent insulating materials compatible with the remaining components of the structure can be utilized such as, for example, silicon oxide, oxides of mercury cadmium telluride, composites thereof and others. A layer of nickel 5 is formed over the insulating layer 3, this nickel layer being on the order of 60 Angstroms in thickness and an aluminum layer 7 having a thickness of approximately 600 Angstroms is formed over the nickel layer. An aperture 9 is formed through the aluminum layer with the nickel layer remaining over the transparent insulating layer 3. This structure is utilized as an infrared detector by appropriate biasing with an external biasing source as will be explained in more detail hereinbelow.

Figure 2:
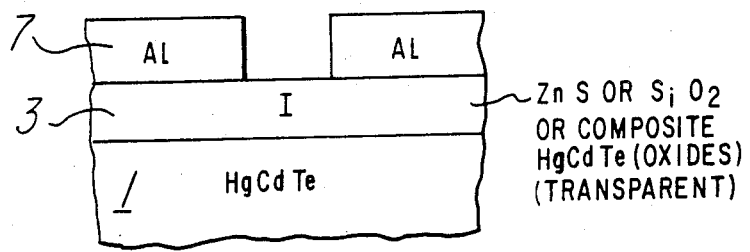
FIG. 2 is the second embodiment of an MIS detector element in accordance with the present invention.

Referring now to FIG. 2, there is shown an second embodiment of an infrared MIS detector element which is identical to that of FIG. 1 except that the nickel layer 5 has been eliminated. As has been described hereinabove, the nickel layer was utilized in the prior art to provide a transparent conductor in the region where the aperture 9 presently exists. Since the nickel does not have particular utility in the present invention, it can be removed to provide the structure of FIG. 2 wherein the remaining layers are formed of the same materials and substantially the same dimensions as described hereinabove with regard to FIG. 1.

Figure 3:
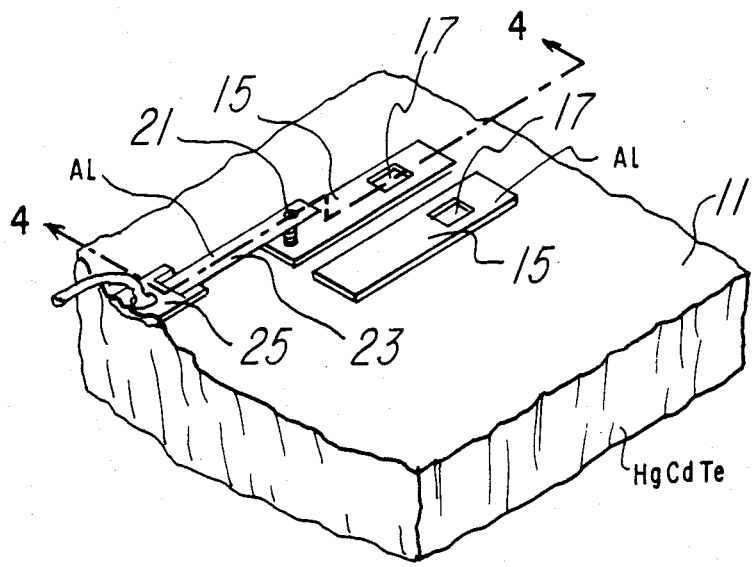
FIG. 3 is a perspective view of an MIS detector in accordance with the present invention.
Figure 4:
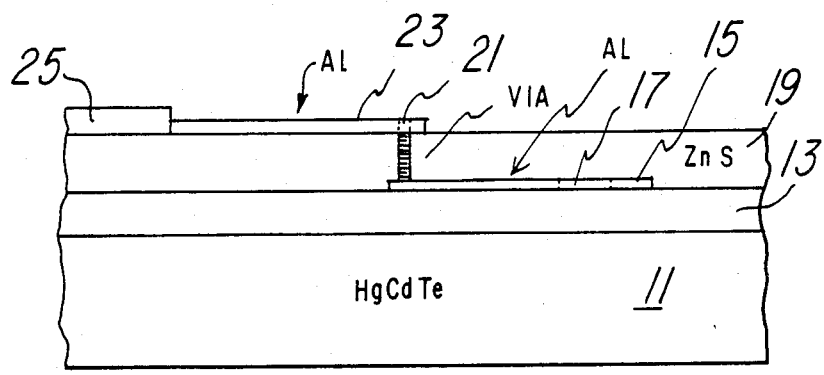
FIG. 4 is a sectional view taken along the line 4—4 of FIG. 3.

Referring now to FIGS. 3 and 4, there is shown an MIS photodetector containing a plurality of photodetector elements for detecting infrared radiations and providing an appropriate output indicative thereof in standard manner. The photodetector includes a p-type mercury cadmium telluride substrate 11 having a first transparent insulating layer 13 thereon, preferably of zinc sulfide as explained hereinabove. A plurality of aluminum gate members 15 having apertures 17 extending therethrough are formed over the insulating layer 13 to provide a plurality of photodetector elements on the single substrate. A further transparent insulating layer 19, preferably of the same material as the insulating layer 13, is then formed over the insulating layer 13 and over the aluminum gate member 15 as shown in FIG. 4. A plurality of vias 21 are then formed each extending from the surface of layer 19 to the surface of an aluminum member 15, and a conductor 23, preferably of aluminum, is formed on the surface of the insulating layer 19 for each of the aluminum members 15. Each conductor 23 is connected to an aluminum gate member 15 by means of conductive material deposited in the via 21 in standard manner. The aluminum conductor 23 is then connected to a further device which, in the present embodiment, is shown as a processor chip connection 25 which can be secured on the surface of the insulating layer 19 or which can be external to the detector and connected to the conductor 23 by other standard known means.

Figure 5:
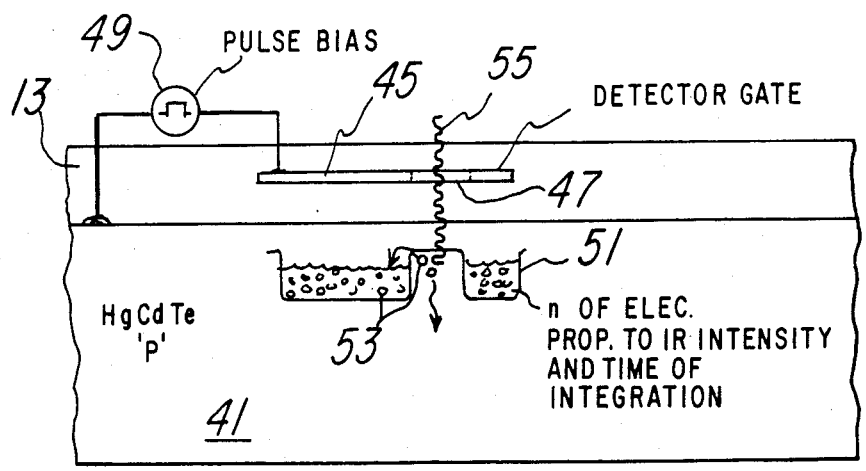
FIG. 5 is a schematic diagram of a portion of the detector set up for operation.

Referring now to FIG. 5, there is shown a schematic diagram of a portion of a photodetector as set up for operation. There is shown schematically a P-type mercury cadmium telluride substrate 41 with a transparent insulating layer 43 thereon having a buried aluminum gate element 45 therein. The gate element 45 includes an aperture 47 through which photons of light can pass as was explained hereinabove. A pulse generator 49, is coupled between the substrate 41 and the gate 45 to provide a pulse bias on the gate. When a pulse from the pulse generator 49 is generated to the gate 45, a potential well is generated beneath the gate 45 by change of the surface potential under the gate at the surface of the substrate 41 to create a potential well under the gate and around the aperture 47. This potential well is shown in the schematic diagram as 51. Assuming that a pulse has been provided and the well 51 is created, photons of light 53 will pass through the aperture 47 and the transparent insulating material 43 and strike the semiconductor substrate 41, thereby causing the formation of electrons and holes 55 in well known manner. The potential wells are such that the electrons diffuse and collect at these wells and the holes are driven off into substrate. The charges continue to collect in the well or, in other words integrate therein while the bias voltage is present on gate 45. The voltage on gate 45 is then sampled at the end of a cycle, the voltage thereon providing an indication of the number of electrons collected in the well and thereby providing an indication of the amount of light flux detected by the photodetector. Accordingly, the voltage change on the detector gate 45 is a measure of the infrared intensity of the incoming light. After a sampling has been made and the pulse generator is turned off, the electrons and holes will recombine with the photodetector prepared for a subsequent sampling cycle.

It can be seen that there has been provided a relatively simple MIS infrared detector which is highly efficient relative to prior art MIS infrared detectors in that a much larger proportion of the infrared photons are capable of passing therethrough for detection and wherein a processing operation can be eliminated.

Though the invention has been described with respect to specific preferred embodiments thereof, many variations and modifications will immediately become apparent to those skilled in the art. It is therefor the intention that the appended claims be interpreted as broadly as possible in view of the prior art to include all such variations and modifications.

What is claimed is:

1. A photodetector which comprises,
    (a) a semiconductor substrate,
    (b) a first insulating layer on a surface of said substrate, and
    (c) a gate on said first insulating layer defining an aperture region therewithin, said gate being spaced from said substrate to form a potential well in the region at said substrate surface region immediately beneath said gate and not in the region thereof substantially beneath said aperture, so that photogenerated carriers of a first conductivity type created in said substrate beneath said aperture region diffuse to and are collected in said potential well.

2. A photodetector as set forth in claim 1 further including means surrounded by said gate for transmitting light photons.

3. A photodetector as set forth in claim 1 wherein said gate comprises an electrically conductive layer defining a completely surrounded aperture extending therethrough.

4. A photodetector as set forth in claim 3 wherein said electrically conductive layer is opaque to light photons.

5. A photodetector as set forth in claim 2 wherein said gate comprise an electrically conductive layer defining a completely surrounded aperture extending therethrough.

6. A photodetector as set forth in claim 5 wherein said electrically conductive layer is opaque to light photons.

7. A photodetector as set forth in claim 3 further including (a) a second transparent insulating layer disposed over both said first insulating layer and said electrically conductive layer to bury said electrically conductive layer and (b) electrically conductive means for coupling said conductive layer to the outer surface of said second insulating layer.

8. A photodetector as set forth in claim 4 further including a second transparent insulating layer disposed over both said first insulating layer and said electrically conductive layer to bury said electrically conductive layer and (b) electrically conductive means for coupling said conductive layer to the outer surface of said second insulating layer.

9. A photodetector as set forth in claim 5 further including (a) a second transparent insulating layer disposed over both said first insulating layer and said electrically conductive layer to bury said electrically conductive layer and (b) electrically conductive means for coupling said conductive layer to the outer surface of said second insulating layer.

10. A photodetector as set forth in claim 6 further including (a) a second transparent insulating layer disposed over both said first insulating layer and said electrically conductive layer to bury said electrically conductive layer and (b) electrically conductive means for coupling said conductive layer to the outer surface of said second insulating layer.

11. A photodetector as set forth in claim 7 wherein said semiconductor substrate is P-type mercury cadmium telluride, said first and second insulating layers are formed from a material taken from the class consisting of zinc sulfide, silicon oxide, an oxide of cadmium, tellurium or mercury and mixtures thereof.

12. A photodetector as set forth in claim 8 wherein said semiconductor substrate is P-type mercury cadmium telluride, said first and second insulating layers are formed from a material taken from the class consisting of zinc sulfide, silicon oxide, an oxide of cadmium, tellurium or mercury and mixtures thereof.

13. A photodetector as set forth in claim 9 wherein said semiconductor substrate is P-type mercury cadmium telluride, said first and second insulating layers are formed from a material taken from the class consisting of zinc sulfide, silicon oxide, an oxide of cadmium, tellurium or mercury and mixtures thereof.

14. A photodetector as set forth in claim 10 wherein said semiconductor substrate is P-type mercury cadmium telluride, said first and second insulating layers are formed from a material taken from the class consisting of zinc sulfide, silicon oxide, an oxide of cadmium, tellurium or mercury and mixtures thereof.

15. A photodetector as set forth in claim 7 wherein said conductive layer is aluminum.

16. A photodetector as set forth in claim 8 wherein said conductive layer is aluminum.

17. A photodetector as set forth in claim 9 wherein said conductive layer is aluminum.

18. A photodetector as set forth in claim 10 wherein said conductive layer is aluminum.

19. A photodetector as set forth in claim 11 wherein said conductive layer is aluminum.

20. A photodetector as set forth in claim 12 wherein said conductive layer is aluminum.

21. A photodetector as set forth in claim 13 wherein said conductive layer is aluminum.

22. A photodetector as set forth in claim 14 wherein said conductive layer is aluminum.

* * * * *